(12) United States Patent
Pu et al.

(10) Patent No.: US 12,002,787 B2
(45) Date of Patent: Jun. 4, 2024

(54) MULTI-DIE PACKAGE STRUCTURE AND MULTI-DIE CO-PACKING METHOD

(71) Applicant: Chengdu Monolithic Power Systems Co., Ltd., Chengdu (CN)

(72) Inventors: Yingjiang Pu, Chengdu (CN); Hunt Jiang, Saratoga, CA (US)

(73) Assignee: Chengdu Monolithic Power Systems Co., Ltd., Sichuan (CN)

( * ) Notice: Subject to any disclaimer, the term of this patent is extended or adjusted under 35 U.S.C. 154(b) by 174 days.

(21) Appl. No.: 17/545,229

(22) Filed: Dec. 8, 2021

(65) Prior Publication Data

US 2022/0208731 A1 Jun. 30, 2022

(30) Foreign Application Priority Data

Dec. 30, 2020 (CN) .......................... 202011610872.1

(51) Int. Cl.
*H01L 25/065* (2023.01)
*H01L 21/56* (2006.01)
*H01L 23/00* (2006.01)
*H01L 23/538* (2006.01)
*H01L 25/00* (2006.01)

(52) U.S. Cl.
CPC .......... *H01L 25/0657* (2013.01); *H01L 21/56* (2013.01); *H01L 23/5383* (2013.01); *H01L 23/5389* (2013.01); *H01L 24/16* (2013.01); *H01L 24/32* (2013.01); *H01L 24/48* (2013.01); *H01L 25/50* (2013.01); *H01L 2224/16227* (2013.01); *H01L 2224/32145* (2013.01); *H01L 2224/48227* (2013.01)

(58) Field of Classification Search
CPC . H01L 23/5383; H01L 23/5389; H01L 24/16; H01L 24/32; H01L 24/48; H01L 21/56; H01L 25/0657; H01L 25/50; H01L 24/19; H01L 24/20; H01L 24/73; H01L 24/83; H01L 25/0652; H01L 2224/16227; H01L 2224/48227; H10B 80/00
USPC ........................................................ 257/777
See application file for complete search history.

(56) References Cited

U.S. PATENT DOCUMENTS

| | | | |
|---|---|---|---|
| 7,944,048 B2 | 5/2011 | Jiang | |
| 8,461,669 B2 | 6/2013 | Yang et al. | |
| 8,604,597 B2 | 12/2013 | Jiang | |
| 8,906,797 B2 | 12/2014 | Jiang | |
| 8,928,305 B2 | 1/2015 | Ueunten et al. | |
| 9,401,648 B2 | 7/2016 | Li | |
| 9,425,689 B2 | 8/2016 | Li et al. | |
| 10,186,500 B2 * | 1/2019 | Ryu | H01L 24/19 |
| 2010/0123215 A1 * | 5/2010 | Pan | H01L 23/5286 |
| | | | 257/532 |
| 2011/0228464 A1 * | 9/2011 | Guzek | H01L 23/5389 |
| | | | 257/E21.598 |
| 2012/0273929 A1 * | 11/2012 | Jiang | H01L 23/49816 |
| | | | 257/673 |

(Continued)

OTHER PUBLICATIONS

U.S. Appl. No. 16/711,394, filed Dec. 11, 2019, Chengdu Monolithic Power Systems.

*Primary Examiner* — Jasmine J Clark
(74) *Attorney, Agent, or Firm* — Perkins Coie LLP

(57) ABSTRACT

A multi-die package structure with an embedded die embedded in a substrate, a flip chip die mounted above the substrate, and an attached die attached onto the flip chip die. The package is compact and low cost.

12 Claims, 4 Drawing Sheets

(56) References Cited

U.S. PATENT DOCUMENTS

| | | |
|---|---|---|
| 2017/0185107 A1 | 6/2017 | Kwon |
| 2019/0050040 A1 | 2/2019 | Baskaran et al. |
| 2019/0279925 A1 | 9/2019 | Hsu et al. |
| 2020/0075567 A1 | 3/2020 | Collins |
| 2020/0212018 A1 | 7/2020 | Lai et al. |
| 2022/0199581 A1 | 6/2022 | Pu et al. |
| 2022/0208732 A1 | 6/2022 | Pu et al. |

* cited by examiner

MULTI-DIE PACKAGE STRUCTURE AND MULTI-DIE CO-PACKING METHOD

CROSS-REFERENCE TO RELATED APPLICATIONS

This application claims priority to and the benefit of Chinese Patent Application No. 202011610872.1, filed Dec. 30, 2020, which is incorporated herein by reference in its entirety.

FIELD

The present invention relates to semiconductor packages, and more particularly relates to multi-die package structures.

BACKGROUND

The requirements for customer electronics products have increased significantly in recent years. Miniaturization and portability are overwhelming trends which push the IC package to be more compact. Accordingly, the electronic portable devices become smaller and smaller along with more functions and better performances. Thus, today's power supply systems are required to have smaller size along with higher power output, more functions and better efficiency. Under these requirements, some technology incorporate switching devices such as FETs and controllers into a monolithic die. However, the controllers typically adopt CMOS process which may need 18-20 masks during fabrication, while the FETs typically adopt DMOS process which needs 8-9 masks during the fabrication. So such monolithic die costs a lot in order to fabricate the FETs together with the controller.

SUMMARY

It is an object of the present invention to provide a solution, which solves the above problems.

In accomplishing the above and other objects, there has been provided, in accordance with an embodiment of the present invention, a multi-die package structure, comprising: an embedded die, configured to be embedded in a substrate; a flip chip die, configured to be mounted above the substrate, the flip chip die being electrically coupled to the substrate by way of a conductor; and an attached die, configured to be attached onto the flip chip die, the attached die being configured to contact with the substrate by way of a bonding wire.

In accomplishing the above and other objects, there has been provided, in accordance with an embodiment of the present invention, a multi-die co-packed chip, comprising: an input pin, configured to receive an input voltage, the input pin electrically coupled to a first die on which a high side power switch is fabricated; a switch pin, electrically coupled to the first die and a second die on which a low side power switch is fabricated; a ground pin, electrically coupled to the second die; and a control pin, configured to receive a control signal, the control pin electrically coupled to a third die on which a control circuit is fabricated; wherein either one of the first die, the second die or the third die is embedded in a substrate as an embedded die; and wherein either one of the remaining two dies is mounted above the substrate as a flip chip die; and the remaining die is attached onto the flip chip die as an attached die.

In accomplishing the above and other objects, there has been provided, in accordance with an embodiment of the present invention, a multi-die co-packing method, comprising: embedding an embedded die in a substrate, the substrate having multiple metal layers; mounting a flip chip die over the substrate; attaching an attached die onto the flip chip die; electrically coupling the embedded die to the flip chip die and the substrate by way of a conductor; and electrically coupling the attached die to the substrate by way of a bonding wire; and molding the embedded die, the flip chip die, the attached die, and the substrate as a package.

The use of the similar reference label in different drawings indicates the same of like components.

DETAILED DESCRIPTION

Embodiments of circuits for multi-die package structure incorporating embedded die and flip chip dies are described in detail herein. In the following description, some specific details, such as example circuits for these circuit components, are included to provide a thorough understanding of embodiments of the invention. One skilled in relevant art will recognize, however, that the invention can be practiced without one or more specific details, or with other methods, components, materials, etc.

The following embodiments and aspects are illustrated in conjunction with circuits and methods that are meant to be exemplary and illustrative. In various embodiments, the above problem has been reduced or eliminated, while other embodiments are directed to other improvements.

Figure 1:
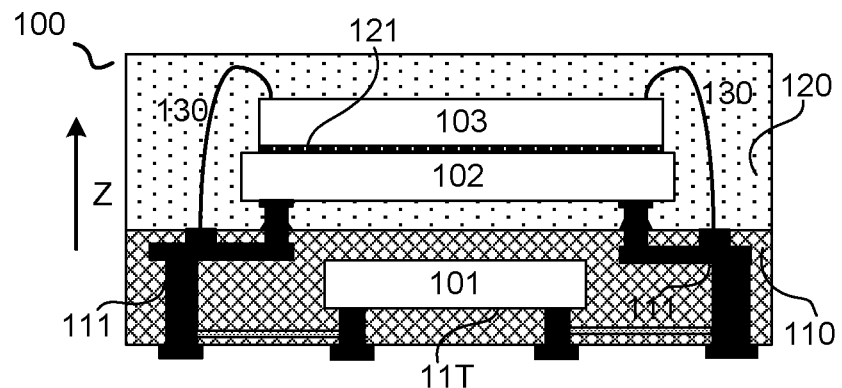
FIG. 1 schematically shows a sectional view of a multi-die package structure 100 in accordance with an embodiment of the present invention.

FIG. 1 schematically shows a sectional view of a multi-die package structure 100 in accordance with an embodiment of the present invention. In the example of FIG. 1, the multi-die package structure 100 comprises: an embedded die 101, configured to be embedded in a substrate 110; a flip chip die 102, configured to be mounted above the substrate 110, the flip chip die 102 being configured to contact with the substrate 110 by way of a conductor 111 (e.g., a contact bump, or a via structure, or a metal trace); and an attached die 103, configured to be attached onto the flip chip die 102

(e.g. by way of an attach adhesive 121), the attached die 103 being configured to contact with the substrate 110 by way of a bonding wire 130.

In one embodiment of the present invention, integrated circuit/circuits and electric contact pads (e.g. contact bumps) are formed on an active surface (first surface) 11T of the embedded die 101. In one embodiment of the present invention, this active surface is also called as an upper surface or as a top surface; and the embedded die 101 also has a second surface opposite to the first surface, which is also called as a bottom surface.

One skilled in the art should realize that the term "flip chip die" in one embodiment may include any die that the contact area of the die directly connects with lead frame structure or package substrate by bumps; the term "substrate" may refer to a package-level material similar as that used in a printed circuit board (PCB), which typically has multiple metal layers; the term "contact bump" may refer to a small metal solid in a ball or pillar shape usually comprises the solder material used to directly connect two contact areas; and the term "attached die" may refer to a chip die that is attached to some part of the package structure using a package-level attach adhesive.

In one embodiment of the present invention, vias are added in the dies and in the substrate, which are then filled with metal material such as copper, to form metal traces between different dies, between the dies and the substrate, and between the dies and the external contact.

Figure 2:
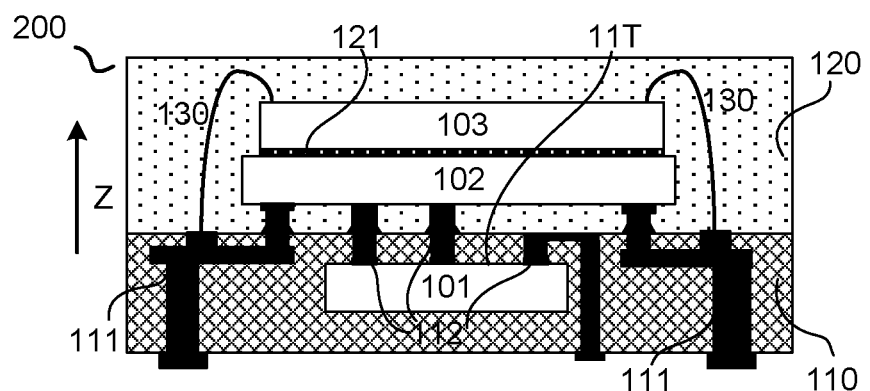
FIG. 2 schematically shows a sectional view of a multi-die package structure 200 in accordance with an embodiment of the present invention.

In one embodiment of the present invention, the active surface 11T of the embedded die 101 may face down (i.e., the active surface 11T faces to the substrate 110, as shown in FIG. 1), or face up (i.e., the active surface 11T faces to the flip chip die 102, as shown in FIG. 2). As shown in FIG. 1, when the active surface 11T of the embedded die 101 faces down, the active surface 11T of the embedded die 101 is configured to contact with the substrate 110 by way of a first conductor (e.g. via structures). As shown in FIG. 2, when the active surface 11T of the embedded die 101 faces up, the active surface 11T of the embedded die 101 is configured to contact with the flip chip die 102 and the substrate 110 by way of a second conductor (e.g. via structures and contact bumps) 112.

In one embodiment of the present invention, the substrate comprises multiple metal layers; and the embedded die, the flip chip die, and the attached die is respectively led out through different metal layers of the substrate, to act as external pins.

In one embodiment of the present invention, the conductor 112 is led out from a bottom surface of the substrate 110 by way of metal traces and through vias, so as to act as an input and/or an output terminal of the embedded die 101.

In one embodiment of the present invention, the multi-die package structures 100 and 200 further comprise: molding material 120, encapsulating and protecting the flip chip die 102, the attached die, and the substrate 110. In one embodiment of the present invention, molding material comprises a kind of electrical insulation material such as epoxy.

In one embodiment of the present invention, partial periphery of the embedded die 101 is overlapped with partial periphery of the flip chip die 102 in vertical direction (Z direction as shown in FIG. 2), i.e., the embedded die 101 has an active surface that is at least partly overlapped by the flip chip die 102, so that the conductor between the flip chip die 102 and the embedded die 101 has shortest vertical contact bump and less parasitic resistance. However, one skilled in the art should realize that in other embodiments of the present invention, the embedded die 101 may have no overlap with the flip chip die 102 in vertical direction, as shown in FIG. 3.

Figure 3:
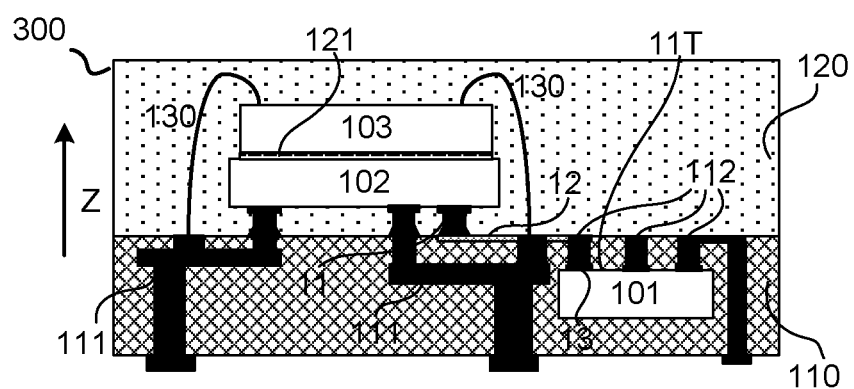
FIG. 3 schematically shows a sectional view of a multi-die package structure 300 in accordance with an embodiment of the present invention.
Figure 4:
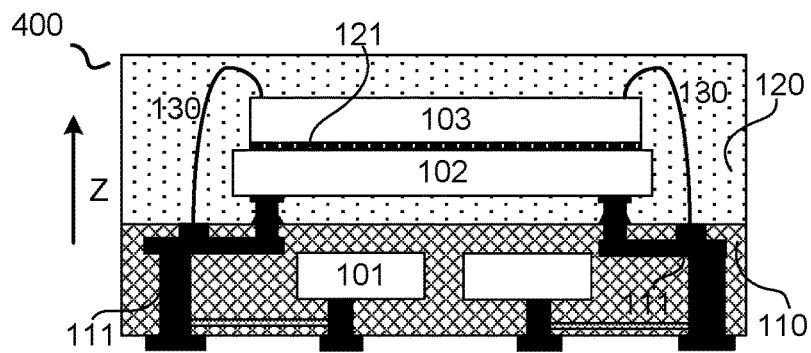
FIG. 4 schematically shows a sectional view of a multi-die package structure 400 in accordance with an embodiment of the present invention.
Figure 5:
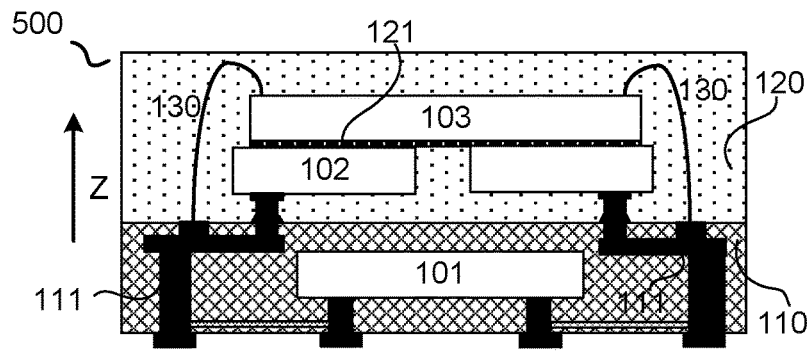
FIG. 5 schematically shows a sectional view of a multi-die package structure 500 in accordance with an embodiment of the present invention.
Figure 6:
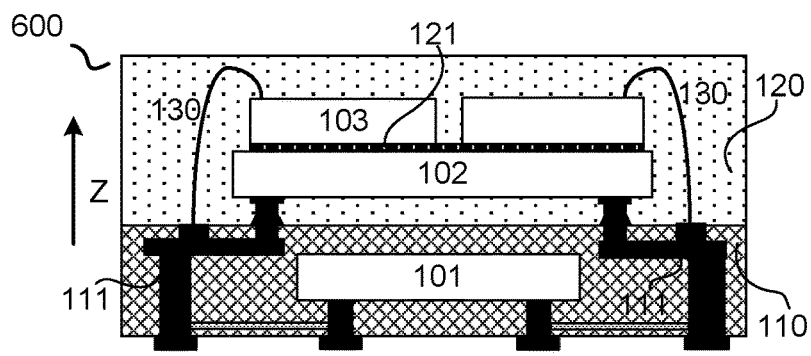
FIG. 6 schematically shows a sectional view of a multi-die package structure 600 in accordance with an embodiment of the present invention.
Figure 7:
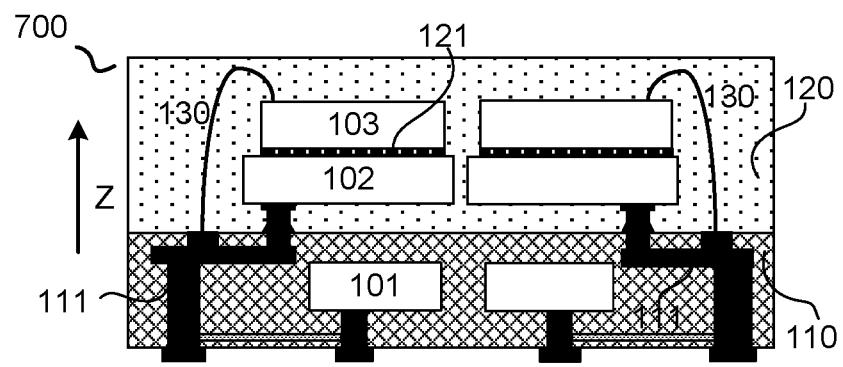
FIG. 7 schematically shows a sectional view of a multi-die package structure 700 in accordance with an embodiment of the present invention.

FIG. 3 schematically shows a multi-die package structure 300 in accordance with an embodiment of the present invention. The multi-die package structure 300 in FIG. 3 is similar to the multi-die package structure 100 in FIG. 2, with a difference that in the embodiment of FIG. 3, the embedded die 101 has no overlap with the flip chip die 102 in vertical direction; and the conductor 112 between the embedded die 101 and the flip chip die 102 comprises a contact bump 11 (the part that contacts with the flip chip die 102 in vertical direction), a metal trace 12 (in planar direction) and a via structure (or contact bump) 13 (the part that contacts with the embedded die 101).

That is, in some embodiments of the present invention, the conductor may comprise a contact bump and a via structure (e.g., the conductor between the embedded die 101 and the flip chip die 102 as shown in FIG. 2); in some embodiments of the present invention, the conductor may comprise a contact bump, a via structure and a metal trace (e.g., the conductor between the embedded die 101 and the flip chip die 102 as shown in FIG. 3); and in some embodiments of the present invention, the conductor may comprise a contact bump and a through via (e.g., the conductor between the flip chip die 102 and the substrate 110 in FIGS. 1, 2 & 3).

In one embodiment of the present invention, the vertical direction is a direction vertical to the die plane, i.e., vertical to the active surface of the embedded die 101.

Several embodiments of the foregoing multi-die package structures have one embedded die with one flip chip die and one attached die co-packed in one package outline. However, one skilled in the art should realize that in other embodiments of the present invention, the multi-die package structure may comprise one or more embedded dies with one or more flip chip dies, and one or more attached dies co-packed in one package outline. As schematically shown in FIGS. 4-7, sectional views of multi-die package structures 400, 500, 600 and 700 are illustrated. These embodiments schematically show the combination of one or two embedded dies with one or two flip chip dies and one or two attached dies. However, one skilled in the art should realize that in other embodiments of the present invention, the multi-die package structure may comprise any desired number of embedded dies, flip chip dies, and attached dies co-packed in one package outline; and the embedded die may have overlap or have no overlap with the flip chip die in vertical direction.

In one embodiment of the present invention, the embedded die 101, the flip chip die 102 and the attached die 103 may respectively comprise switch power devices and a controller operable to control the switch power devices. For example, the embedded die 101 and the flip chip die 102 may both comprise a switch power device, and the attached die 103 may comprise the corresponding controller; or the flip chip die 102 and the attached die 103 may both comprise a switch power device, and the embedded die 101 may comprise the corresponding controller; or the embedded die 101 and the attached die 103 may both comprise a switch power device, and the flip chip die 102 may comprise the corresponding controller. One skilled in the art should realize that in other embodiments of the present invention, the embedded die 101, the flip chip die 102 and the attached die 103 may comprise other any desired circuits and devices.

Figure 8:
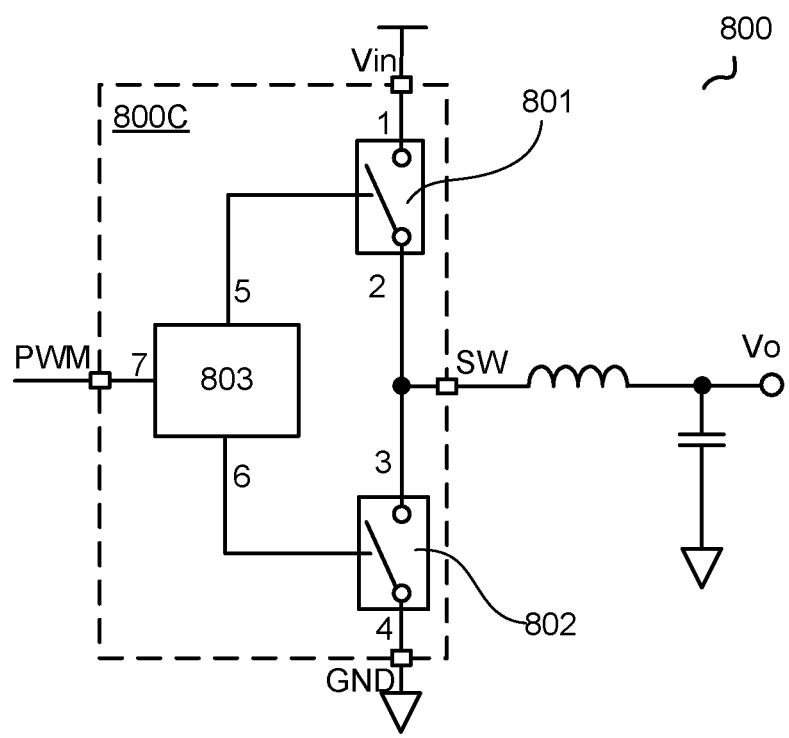
FIG. 8 schematically shows a buck converter 800 in accordance with an embodiment of the present invention.

FIG. 8 schematically shows a buck converter 800 in accordance with an embodiment of the present invention. In the example of FIG. 8, the buck converter 800 comprises: a multiple-die co-packed chip 800C including: an input pin Vin, configured to receive an input voltage, the input pin Vin electrically coupled to a first die 801 on which a high side power switch is fabricated; a switch pin SW, electrically coupled to the first die 801 and a second die 802 on which a low side power switch is fabricated; a ground pin GND, electrically coupled to the second die 802; and a control pin PWM, configured to receive a control signal (e.g. from a pre-stage), the control pin PWM electrically coupled to a third die 803 on which a control circuit is fabricated; wherein either one of the first die 801, the second die 802 or the third die 803 is embedded in a substrate as an embedded die, and wherein either one of the remaining two dies is mounted above the substrate as a flip chip die, and the remaining die is attached onto the flip chip die as an attached die.

In one embodiment of the present invention, the high side power switch and the low side power switch are controlled by the control circuit.

Continue referring to FIG. 8, the first die 801 having a first terminal 1 electrically coupled to the input pin Vin, a second terminal 2 electrically coupled to the switch pin SW, and a control terminal electrically coupled to the third die 803. The second die 802 having a first terminal 3 electrically coupled to the switch pin SW, a second terminal 4 electrically coupled to the ground pin GND, and a control terminal electrically coupled to the third die 803. The third die 803 having an input terminal 7 electrically coupled to the control pin PWM, a first output terminal 5 electrically coupled to the control terminal of the first die 801, and a second output terminal 6 electrically coupled to the control terminal of the second die 802.

In one embodiment of the present invention, the buck converter 800 further comprises an inductor and an output capacitor, both coupled to the switch pin SW of the multi-die package chip 800C, to provide an output voltage Vo.

Several embodiments of the foregoing multi-die package structure provide much compact solution for smaller package size and less parasitic RLC (resistance, inductance and capacitance), which brings better performance. Unlike the conventional technique, several embodiments of the foregoing multi-die package structure may adopt different process to fabricate different dies (e.g., the flip chip die and the attached die with one process and the embedded die with another process), and then co-pack the dies together with some of the dies embedded in the substrate, and the other dies mounted above the substrate, and contacting with the embedded dies and with the substrate through contact bumps. Thus the total cost is down. In addition, the embedded die is overlapped with the flip chip die partially in a direction vertical to the die plane, resulting a smaller package size, which further saves the cost.

Figure 9:
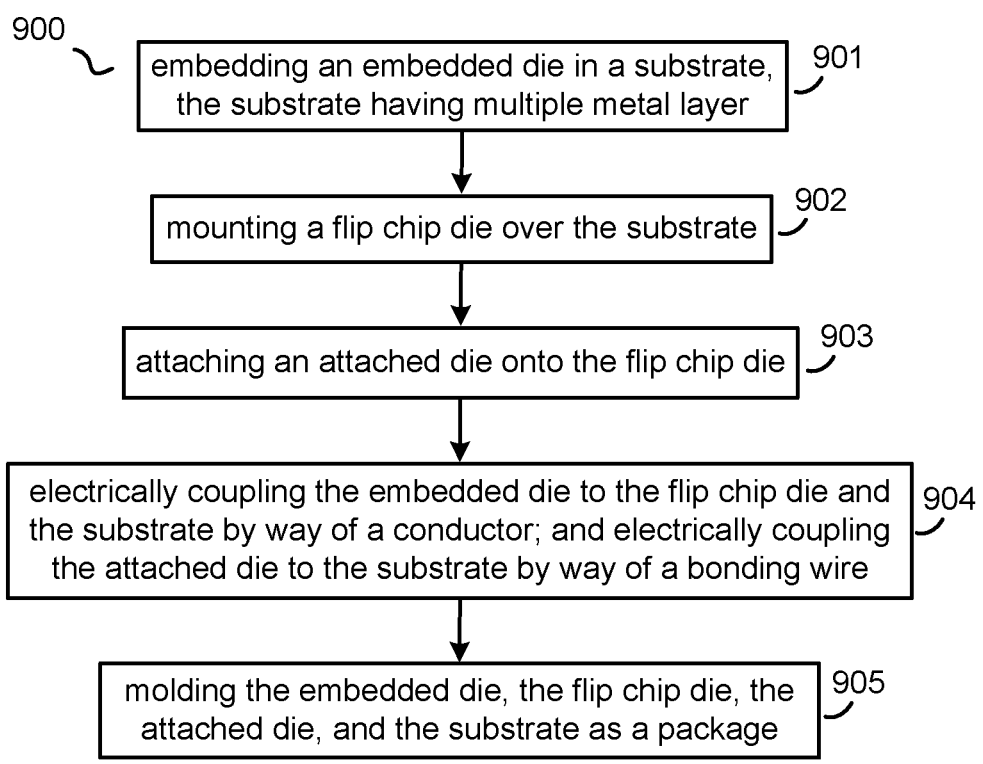
FIG. 9 schematically shows a flowchart 900 of a multi-die co-packing method in accordance with an embodiment of the present invention.

FIG. 9 schematically shows a flowchart 900 of a multi-die co-packing method in accordance with an embodiment of the present invention. The method comprising:

Step 901, embedding an embedded die in a substrate, the substrate having multiple metal layers.

Step 902, mounting a flip chip die over the substrate.

Step 903, attaching an attached die onto the flip chip die.

Step 904, electrically coupling the embedded die to the flip chip die and the substrate by way of a conductor; and electrically coupling the attached die to the substrate by way of a bonding wire. And Step 905, molding the embedded die, the flip chip die, the attached die, and the substrate as a package.

In one embodiment of the present invention, the method further comprising pre-planting solder balls at the bottom surface of the substrate.

In one embodiment of the present invention, the conductor between the embedded die, the flip chip die and the substrate may comprise a contact bump, and/or a metal trace.

In one embodiment of the present invention, the embedded die, the flip chip die, and the attached die is respectively led out through different metal layers of the substrate, to act as external pins.

In one embodiment of the present invention, partial periphery of the embedded die is overlapped with partial periphery of the flip chip die in vertical direction perpendicular with the embedded die.

It is to be understood in these letters patent that the meaning of "A" is coupled to "B" is that either A and B are connected to each other as described below, or that, although A and B may not be connected to each other as described above, there is nevertheless a device or circuit that is connected to both A and B. This device or circuit may include active or passive circuit elements, where the passive circuit elements may be distributed or lumped-parameter in nature. For example, A may be connected to a circuit element that in turn is connected to B.

This written description uses examples to disclose the invention, including the best mode, and also to enable a person skilled in the art to make and use the invention. The patentable scope of the invention may include other examples that occur to those skilled in the art.

What is claimed is:

1. A multi-die package structure, comprising:
    a first die embedded in a substrate;
    a second die mounted above the substrate, the second die being electrically coupled to the substrate by way of a conductor; and
    a third die attached onto the second die, the third die being configured to contact with the substrate by way of a bonding wire.

2. The multi-die package structure of claim 1, wherein the first die has an active surface, and the active surface is at least partly overlapped by the second die.

3. The multi-die package structure of claim 1, wherein the first die has an active surface facing up to the second die, and the active surface is electrically coupled to the substrate and the second die by way of the conductor.

4. The multi-die package structure of claim 3, wherein the conductor comprises a contact bump, a via structure and a metal trace.

5. A multi-die co-packed chip, comprising:
    an input pin, electrically coupled to a first die on which a high side power switch is fabricated;
    a switch pin, electrically coupled to the first die and a second die on which a low side power switch is fabricated;
    a ground pin, electrically coupled to the second die; and
    a control pin, electrically coupled to a third die on which a control circuit is fabricated;
    wherein any one of the first die, the second die or the third die is embedded in a substrate as an embedded die; and
    wherein either one of the remaining two dies is mounted above the substrate as a flip chip die; and
    the remaining die is attached onto the flip chip die as an attached die.

6. The multi-die co-packed chip of claim 5, wherein:
the embedded die has an active surface at least partly overlapped with partial periphery of the flip chip die in a direction vertical to the active surface.

7. The multi-die co-packed chip of claim 5, wherein:
the flip chip die is electrically coupled to the substrate and the embedded die by way of a conductor.

8. The multi-die co-packed chip of claim 5, wherein:
the attached die is electrically coupled to the substrate by way of a wire bonding.

9. A multi-die co-packing method, comprising:
embedding a first die in a substrate, the substrate having multiple metal layers;
mounting a second die over the substrate;
attaching a third die onto the second die;
electrically coupling the first die to the second die and the substrate by way of a conductor; and electrically coupling the third die to the substrate by way of a bonding wire; and
molding the first die, the second die, the third die, and the substrate as a package.

10. The multi-die co-packing method of claim 9, wherein:
the first die has an active surface, and the active surface is at least partly overlapped by the second die.

11. The multi-die co-packing method of claim 10, wherein: the conductor comprises a contact bump, a via structure or a metal trace.

12. The multi-die co-packing method of claim 10, wherein: the conductor comprises a contact bump and a through via.

\* \* \* \* \*